United States Patent [19]

Alpaugh et al.

[11] Patent Number: 4,525,390

[45] Date of Patent: Jun. 25, 1985

[54] DEPOSITION OF COPPER FROM ELECTROLESS PLATING COMPOSITIONS

[75] Inventors: Warren A. Alpaugh, Chenango Forks; William J. Amelio, Binghamton; Voya Markovich, Endwell; Carlos J. Sambucetti, Croton-on-Hudson, all of N.Y.

[73] Assignee: International Business Machines Corporation, Armonk, N.Y.

[21] Appl. No.: 588,035

[22] Filed: Mar. 9, 1984

[51] Int. Cl.³ .................................................. C23C 3/02
[52] U.S. Cl. ............................... 427/305; 427/437; 427/443.1; 427/404; 106/1.23; 106/1.26
[58] Field of Search ................. 427/437, 443.1, 305, 427/404; 106/1.23, 1.26

[56] References Cited

U.S. PATENT DOCUMENTS

| | | | |
|---|---|---|---|
| 2,996,408 | 8/1961 | Lukes | 427/304 |
| 3,485,643 | 12/1969 | Zeblisky | |
| 3,615,732 | 10/1971 | Shipley | 106/1.26 |
| 3,615,733 | 10/1971 | Shipley | 106/1.26 |
| 3,650,777 | 3/1972 | Schneble | 106/1.26 |
| 3,844,799 | 10/1974 | Underkofler | 106/1.26 |
| 3,900,599 | 8/1975 | Feldstein | 427/97 |
| 3,959,531 | 5/1976 | Schneble | 427/345 |
| 4,152,467 | 5/1979 | Alpaugh | 427/98 |
| 4,160,049 | 7/1979 | Narcus | 427/404 |
| 4,169,171 | 9/1979 | Narcus | 427/404 |
| 4,448,804 | 5/1984 | Amelio | 427/98 |

*Primary Examiner*—John D. Smith
*Attorney, Agent, or Firm*—Pollock, Vande Sande & Priddy

[57] ABSTRACT

Copper is deposited onto a substrate by plating a first layer of copper onto the substrate from an electroless plating bath and plating a second layer of copper onto the first layer of copper from a second and different electroless plating bath. The first and second plating baths differ from each other in at least the cyanide content and oxygen content. The process reduces plating void defects and reduces nodule formation.

20 Claims, No Drawings

DEPOSITION OF COPPER FROM ELECTROLESS PLATING COMPOSITIONS

DESCRIPTION

1. Technical Field

The present invention is concerned with a method for depositing copper onto a substrate from electroless plating compositions. The present invention is especially directed to providing high-quality articles such as those to be employed in printed circuit applications such as printed circuit boards. The process of the present invention makes it possible to substantially reduce the presence of plating voids from the plating and to substantially reduce the formation of extraneous copper or nodules.

2. Background Art

The electroless plating of copper onto a substrate is well-known in the art. For instance, an electroless or autocatalytic copper plating bath usually contains a cupric salt, a reducing agent for the cupric salt, a chelating or complexing agent, and a pH adjustor. In addition, if the surface being plated is not already catalytic for the deposition of the desired metal, a suitable catalyst is deposited onto the surface prior to contact with the plating bath. Among the more widely employed procedures for catalyzing a surface is the use of stannous chloride sensitizing solution and a palladium chloride activator to form a layer of metallic palladium particles.

Although the technology relative to electroless copper plating is continually being improved, there still remains room for additional improvement. Certain problems are especially pronounced when preparing articles of very high quality such as those to be employed in printed circuit applications, e.g.-printed circuit boards which contain high-density circuitry and large numbers of holes such as through-holes and blind holes. The problems encountered include the formation of voids on the surface and in the coatings located in the holes. This, in turn, can cause unreliable electrical connections. Moreover, even if the electrical connections initially are adequate, the presence of voids tends to cause the coatings to crack during use of the circuits. During operation, integrated circuit boards tend to expand and contract somewhat. Any discontinuities in the coating represent a prime site for cracking due to the mechanical stress from such expansion and contraction.

Moreover, a major reason for yield loss in electroless plating is the formation of what is known as extraneous copper or copper nodules. The formation of nodules in unwanted areas on the substrate can result in short-circuiting by forming contact between circuit lines on the substrate. In addition, such processes as providing protective coatings, providing solder, and tin insertion are adversely affected by the presence of nodules on the surface.

Various attempts to reduce void formation result in significant increase in the formation of nodules. Likewise, attempts to reduce nodule formation have resulted in significant increase in void formation. Accordingly, it would be advantageous and desirable to reduce the formation of voids without a significant increase in the formation of extraneous copper or nodules.

Also, attempts to improve the ductility of the copper have resulted in significantly increasing the plating time. Accordingly it would be desirable to provide for improved copper ductility without a significant increase in the time for the plating.

SUMMARY OF INVENTION

The present invention provides a method for significantly reducing if not entirely eliminating, the formation of voids during plating, from an electroless plating bath. In addition, the present invention makes it possible to reduce plating voids without increasing the formation of extraneous copper or copper nodules.

In addition, the present invention makes it possible to provide copper plating having high ductility properties without a concomitant increase in the time required for plating.

The present invention is concerned with a process for depositing copper onto a substrate from an electroless plating solution. In particular, the process of the present invention comprises plating a first layer of copper onto the desired substrate form a first alkaline electroless plating bath. The first alkaline plating bath contains about 4 to about 7 ppm of cyanide ions and has an oxygen content of 1.5 ppm or less. A second layer of copper is plated onto the first layer of copper from a second alkaline electroless copper plating bath. The second electroless copper plating bath contains about 8 to about 10 ppm of cyanide ions and has an oxygen content of about 2.5 to about 4 ppm. These oxygen content values are for the plating bath when at a temperature of about 70° C. to 80° C.

BEST AND VARIOUS MODES FOR CARRYING OUT INVENTION

According to the present invention, it has been found that improved plating can be achieved by plating sequentially from two different electroless copper plating baths whereby the cyanide ion concentrations and oxygen content concentrations of each bath differ from each other and are judiciously selected.

In particular, the first plating bath contains about 4 to about 7 ppm of cyanide ions and has an oxygen content of 1.5 ppm or less. The second electroless copper plating bath contains about 8 to about 10 ppm of cyanide ions and has an oxygen content of about 2.5 to about 4 ppm. These oxygen content values are for the plating bath when at a temperature of about 70° C. to 80° C.

The surface upon which the metal is plated must be catalytic for the deposition of the copper. For instance, in the event the surface being plated is not already catalytic for the deposition of the copper, a suitable catalyst is deposited on the surface prior to contact with the electroless copper plating baths. In the preferred aspects of the present invention, the substrate to be coated is a dielectric substrate which must be rendered catalytic for the deposition of the copper. Dielectric substrates described in the prior art, including thermoplastic and thermosetting resins, and glass, may be coated in accordance with the present invention.

Typical thermosetting polymeric materials include epoxy, phenolic-based materials, and polyamides. The dielectric materials may be molded articles of the polymers containing fillers and/or reinforcing agents such as glass-filled epoxy or phenolic-based materials. Examples of some phenolic-type materials include copolymers of phenol, resorcinol, and cresol. Examples of some suitable thermoplastic polymeric materials include polyolefins such as polypropylene, polysulfones, polycarbonates, nitrile rubbers, and ABS polymers.

The present invention is suitable for coating at least one of the main surfaces of the substrate as well as the plated through holes or vias and/or blind holes of the substrate, when present.

Prior to the initiation of the process of the present invention for coating the dielectric substrate, the holes, if to be present in the circuit board, are made and the dielectric with the holes is suitably cleaned and preconditioned.

For instance, the preconditioning can include creation of active sites by physical means such as sand and/or vapor blasting and/or chemical methods such as solvent swelling. A typical solvent is N-methyl pyrrolidone. The substrate can also be pretreated with a sulfochromic acid composition.

Among the more widely employed procedures for catalyzing or seeding a substrate is the use of a stannous chloride sensitizing solution and a palladium chloride activator to form a layer of metallic palladium particles. For instance, one method for catalyzing a dielectric substrate is exemplified by U.S. Pat. No. 3,011,920 which includes sensitizing the substrate by treating it with a solution of colloidal metal, accelerating the treatment with a selective solvent to remove protective colloids for the sensitized dielectric substrate, and then electrolessly depositing the copper onto the sensitized substrate.

Also, as suggested, for example, in U.S. Pat. No. 3,099,608, a dielectric substrate can be pretreated by depositing a thin film of "conductivator" type of metal particle such as palladium metal from a semicolloidal solution onto the dielectric substrate to provide a conducting base which permits electroplating with a conductive metal on the "conductivated" base. Moreover, U.S. Pat. No. 3,632,388 suggests a method for treating a polymeric plastic substrate in a plating process which utilizes a preliminary chromic acid etch followed by a one-step activation in a tin-palladium hydrosol.

More recently, U.S. Pat. No. 4,066,809 discloses the use of a so-called "triple seeding" technique. This technique includes contacting the surfaces of the dielectric substrate first with a stannous chloride sensitizing solution, then with a palladium chloride activator, and then with a palladium chloride/stannous chloride/hydrochloric acid seeder bath.

In the present invention, prior to the stannous-chloride and palladium-chloride treatment, the substrate can be treated with an aqueous solution containing a multifunctional ionic polymer, as disclosed in U.S. patent application Ser. No. 398,140 to Bupp, et al., now U.S. Pat. No. 4,478,885 disclosure of which is incorporated herein by reference.

The polymer is a multifunctional ionic material in that it contains at least two active or available ionic functional moieties of the same polarity. The polymers are at least water-miscible and are preferably water-soluble or at least soluble in the water compositions employed in the present invention. The preferred ionic moieties are cationic moieties such as quaternary phosphonium and quaternary ammonium groups. Polymers containing at least two ionic moieties are commercially available and need not be described herein in any great detail. Examples of commercially available multifunctional cationic polymers are Reten 210, Reten 220, and Reten 300, available from Hercules, descriptions of which can be found in "Water-Soluble Polymers", Bulletin VC-482A, Hercules Incorporated, Wilmington, Delaware 19899, disclosure of which is incorporated herein by reference.

Reten 210 is in powder form and is a copolymer of acrylamide and betamethacryloxyethyltrimethylammonium methyl sulfate having a Brookfield viscosity of a 1% solution of 600–1000 cps.

Reten 220 is in powder form and is a copolymer of acrylamide and betamethacryloxyethyltrimethylammonium methyl sulfate having a Brookfield viscosity of a 1% solution of 800–1200 cps.

Reten 300 is a liquid and is a homopolymer of betamethacryloxyethyltrimethylammonium methyl sulfate having a Brookfield viscosity of a 1% solution of 300–700 cps.

The molecular weights of the Reten polymers are usually relatively high and vary from about 50,000 to about 1,000,000 or more. These high molecular weight polymers are solid products and their main chemical backbone structure is polyacrylamide. The cationic Reten (positive charged) is obtained by attaching to the polyacrylamide various tetraalkyl ammonium compounds. These quaternary ammonium groups provide the number of positive charges of the polymer.

The ionic polymer is preferably employed as a dilute aqueous solution of about 0.01% to about 1% by weight and preferably, about 0.05% to about 0.5% by weight of the copolymer. The aqueous solution also usually contains an inorganic acid such as HCl, to provide a pH of about 1 to about 7 and preferably, a pH of about 2 to about 3. The use of a pH of about 2 to about 3 is preferred in order to provide a low viscosity for the polymer solution to facilitate application of the polymer. The viscosity drastically increases when the pH is above about 4 to 5. The acid is usually present in amounts of about 2% to about 10% by weight.

The treatment with the ionic polymer is generally about 1 minute to about 10 minutes and preferably about 1 to about 2 minutes.

The multifunctional polymer provides a surface being of a polarity opposite from that associated with the catalyst particles to be subsequently applied to the substrate. This difference in polarity provides for electrostatic attraction of the catalyst particles.

After the substrate is contacted with the ionic polymer composition, the substrate is rinsed to remove any excess polymer not absorbed by the substrate.

Next, the substrate is activated by contact with the composition containing a catalytic composition capable of initiating the electroless copper plating process. The compositions contain a metal which can directly provide the catalytic sites or serve as a precursor which leads to the catalytic sites. The metal present may be in the elemental form, an alloy, or compound, or mixtures thereof. The preferred metal catalysts are precious metals such as gold, palladium, and platinum. In addition, in view of the improved conditioning of the substrate achieved by employing the multifunctional polymer, the catalyst can be a non-precious metal such as copper, nickel, cobalt, iron, zinc, manganese, and aluminum.

The most preferred catalyst is palladium. A typical palladium composition contains about 1.2 to about 2.5 grams per liter of a palladium salt which is preferably $PdCl_2$, about 80 to about 150 grams per liter of a stannous salt which is preferably $SnCl_2.2H_2O$, and about 100 to about 150 milliliters per liter of an acid which is preferably HCl. When HCl is provided in the form of a 37% HCl solution, about 290 to about 360 milliliters of the HCl solution is preferably employed. The most preferred composition contains about 1.5 grams per liter of PdCl$_2$, about 100 grams per liter of SnCl$_2$, and about 280 milliliters per liter of 35% HCl. The composition is usually maintained at a temperature of about 65°±10° F. It is believed that the palladium particles in the solution have associated therewith a negative charge as the pendant charge extending outward therefrom. In particular, it is believed that the following occurs in the palladium chloride solution:

$$Sn^{++} + Pd^{++} \longrightarrow Pd° + Sn^{4+}$$

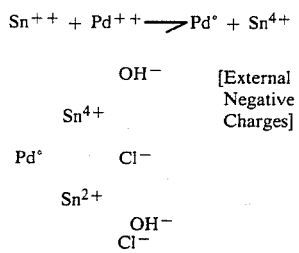

Accordingly, with a palladium-stannous catalyst system, the ionic polymer is a cationic polymer (positively charged).

A typical triple-seeder process includes first contacting the dielectric substrate surfaces in the holes, if present, with a stannous chloride sensitizing solution (SnCl$_2$/HCl). Typically, the contacting time is from about 4 to about 10 minutes with a preferred contact time of about 7 minutes. Contacting the dielectric substrate with this solution conditions the surfaces, including the holes, by depositing a layer thereon of tin (Sn$^{+2}$). The stannous chloride is then rinsed from the substrate and holes with water. A hot water rinse being in a temperature range from about 55° C. to about 80° C. is preferred. The hot water removes any excess stannous chloride and also hydrolyzes the SnCl$_2$ on the surface to produce gelatinous tin hydrous oxides which are absorbed on the surface of the board as a stannous complex.

The next seeding step includes contacting the dielectric substrate surfaces and the hole surfaces, if present, with a palladium chloride activator in which divalent palladium interacts with the stannous compounds on the board surface to form an adherent layer of metallic palladium particles thereon. This may be accomplished by immersing the dielectric in the palladium activator bath for 2±1 minute. This step promotes the adhesion of the final seeding step and increases the concentration of the final catalytic layer which is deposited in the final seeding step.

The third step of the seeding process includes contacting the substrate surfaces and hole surfaces, if present, with a palladium chloride/stannous chloride/hydrochloric acid seeder bath. While a preferred contact time of 5 minutes is desired, it has been found that the actual contact time can vary from about 1 to about 10 minutes and still provide satisfactory results. This step deposits the final catalytic layer which permits the copper to be plated electrolessly on the surface and in the holes of the dielectric substrate.

In preparing the solution for the first step of the process, it has been found that the combination of stannous chloride having a content of between about 53 and about 57 grams per liter of SnCl$_2$.2H$_2$O with 37% hydrochloric acid at a ratio of about 50 milliliters per liter with the pH of the solution adjusted to a range of 0.2 and 0.5, provides a desired preconditioning solution. The SnCl$_2$.2H$_2$O is dissolved in the HCl with the resulting mixture being added to a tank of deionized water. It is generally found that the optimum results are obtained when the pH is approximately 0.4 and the solution is maintained at a temperature of 65°±10° F.

For the second step of the triple-seeder process, the palladium chloride bath is formed by mixing 50 grams of palladium (with a concentration of about 0.13 to about 0.17 grams per liter) with approximately 3780 milliliters of 37% hydrochloric acid (having a concentration of 10 milliliters per liter). The PdCl$_2$ is dissolved in the hydrochloric acid with the resultant mixture being added to a tank of deionized water. Again, the bath is maintained at a temperature of about 65°±10° F., the pH is maintained between 0.75, and 1 and the copper content of the solution is kept below about 50 ppm.

The final catalytic palladium chloride/stannous chloride/hydrochloric acid seeder bath includes a bath comprising about 1.2 to about 2.5 grams per liter of PdCl$_2$ with about 80 to about 150 grams per liter of SnCl$_2$.2H$_2$O together with between about 290 and about 360 milliliters of 37% HCl per liter of solution. This third seeding bath is again maintained at a temperature of about 65°±10° F. The optimum solution of the bath includes about 1.5 grams per liter of PdCl$_2$, about 100 grams per liter of SnCl$_2$, and about 280 milliliters per liter of 37% hydrochloric acid.

The first electroless plating bath employed in accordance with the present invention contains about 4 to about 7 ppm and preferably about 5 to about 6 ppm of cyanide ions and has an oxygen content of 1.5 ppm or less. This value of the oxygen content is for the bath when at a temperature of about 70° C. to 80° C. The first copper electroless plating bath employed is generally an aqueous composition which contains a source of cupric ion, a complexing agent for the cupric ion, and a pH adjustor in addition to the cyanide ion source. In addition, the plating bath also preferably includes a surface-active agent.

The cupric ion source generally used is a cupric sulfate or a cupric salt of the complexing agent to be employed.

The cupric ion source is employed in amounts of about 8.0 to about 8.8 grams per liter and preferably about 8.4 to about 8.8 grams per liter, calculated as CuSO$_4$. In other words, when the cupric ion source is CuSO$_4$, then the amount is about 8.0 to about 8.8 grams per liter, and when the source is a different material, the amount employed will be such that the same amount of cupric ion will be present in the bath as when CuSO$_4$ is used.

The most common reducing agent employed is formaldehyde.

Examples of some other reducing agents include formaldehyde precursors or formaldehyde homopolymers such as paraformaldehyde, trioxane, and glyoxal; borohydrides such as alkali metal borohydrides (sodium and potassium borohydrides) and substituted borohydrides such as sodium trimethoxy borohydride; boranes such as amine borane (isopropyl amine borane and morpholine borane); and hypophosphite reducing agents.

The reducing agent is generally present in amounts from about 2 to about 4 milliliters per liter; and preferably, from about 2 to about 2.5 milliliters per liter.

Examples of some suitable complexing agents include Rochelle salts, ethylene diamine tetraacetic acid, the sodium (mono-, di-, tri-, and tetra-sodium) salts of ethylene diamine tetraacetic acid, nitrilo tetraacetic acid and its alkali salts, gluconic acid, gluconates, triethanol amine, glucono (gamma)-lactone, modified ethylene diamine acetates, such as N-hydroxy ethyl ethylene diamine triacetate. In addition, a number of other suitable cupric complexing agents are suggested in U.S. Pat. Nos. 2,996,408; 3,075,856; 3,076,855; and 2,938,805. The preferred complexing agents are ethylene diamine tetraacetic acid and the alkali metal salts thereof.

The amount of complexing agent employed in the first plating bath is about 40 to about 45 grams per liter.

Examples of some cyanides which can be employed according to the present invention are the alkali metal, alkaline earth metal, and ammonium cyanides, with sodium cyanide being the preferred. The amount of cyanide employed in the first plating bath is about 4 to about 7, ppm and preferably about 5 to about 6 ppm of cyanide ion.

The plating bath can also include a surfactant which assists in wetting the surface to be coated. A satisfactory surfactant is, for instance, an organic phosphate ester, available under the trade designation "Gafac RE-610". Generally, the surfactant is present in amounts from about 0.02 to about 0.3 grams per liter.

In addition, the pH of the bath is generally controlled, for instance, by the addition of a basic compound such as sodium hydroxide or potassium hydroxide in the desired amount to achieve the desired pH. The preferred pH of the first electroless plating bath is between 11.6 and 11.8 and most preferably, between 11.7 and 11.8.

The oxygen content of the initial plating bath is 1.5 ppm or less, and preferably about 0.5 to 1.5 ppm, and most preferably about 1 to 1.5 ppm.

The oxygen content is achieved by not deliberately introducing any air or oxygen into the plating bath, as is usually done for stability purposes. Moreover, if the level of oxygen is above the 1.5 ppm amount and merely avoiding introduction of air or oxygen into the plating bath does not reduce the amount to 1.5 ppm or less, then an inert gas such as hydrogen, nitrogen, argon, neon, and krypton can be injected into the plating bath to expel oxygen therefrom. The above oxygen values are for bath at a temperature of about 70° C. to about 80° C. The oxygen content is determined by measuring with a "dissolved oxygen meter" from L. G. Nestor Company Model 8500C. at a temperature of 25° C. to 50° C. and then calculated to determine the amount at the elevated temperature of the bath. In addition, the plating bath can include other minor additives, as is known in the art.

The preferred plating baths employed have a specific gravity within the range of 1.06 to 1.08. Moreover, the temperature of the bath is preferably maintained between about 70° C. and 80° C, and more preferably between about 70° C. and 75° C., and most preferably about 72° C. to about 74° C.

The plating with the initial electroless plating bath is generally carried out for about 15 minutes to up to about 2 hours and preferably about ½ to about 1½ hours. It is important that this plating bath not be operated for too long a period of time before oxygen is introduced into the bath since such does have the tendency to form nodules in view of the very low oxygen concentration therein. However, it has been found that by employing this initial plating bath for the relatively short time the potential of forming nodules is significantly minimized. The initial plating bath, in view of the low oxygen concentration and cyanide concentration is especially suitable for coating onto catalyzed or seeded dielectric surfaces and provides for a significant reduction of plating defects and plating voids on such surfaces. In fact, increasing the oxygen concentration and cyanide concentration to those levels which would satisfactorily stabilize the bath, and prevent nodular formation, and provide for good ductility is not particularly effective for plating onto the seeded or catalyzed dielectric substrates. Such baths with the increased amounts of cyanide and oxygen tend to attack and dissolve the catalyst coating which is essential to proper seeding and catalyzing of the dielectric substrate.

After the initial layer of copper is plated, the plated substrate is subjected to a second and different electroless plating bath. The bath itself can be changed by the overflow and the amount of constituents being added, or the substrates can be removed from the plating tank and placed into a second plating tank containing the second electroless plating bath. In the preferred aspects of the present invention, the substrates remain in the same plating tank and the plating bath is changed. In particular, the second electroless plating bath contains the same constituents as contained in the first electroless plating bath, except that relative amounts of various of the constituents are changed in order to achieve the high ductility and minimal nodule formation.

The second electroless plating bath contains about 8 to about 10 ppm of cyanide ions and about 2.5 to about 4 ppm of oxygen and preferably about 3 to about 3.5 ppm of dissolved oxygen. These amounts of oxygen are for a bath at a temperature of 70° C. to 80° C.

The above amounts of oxygen are those calculated by employing a "dissolved oxygen meter" from L. G. Nestor Company—8500C and taking measurements at 25° C. to 50° C. Use of different measuring meters may result in different measured values. The level of the oxygen is maintained by introducing into the plating tank a mixture of oxygen and inert gas, preferably by adding air. Mixed with the air or oxygen can be an inert gas such as hydrogen, nitrogen, argon, neon, and krypton. The preferred inert gas, if employed, is nitrogen. At a plating temperature of about 73° C.±0.5° C., about 1.0 to 2.0 SCFM (standard cubic feet per minute) per thousand gallons of bath of air are employed. The amount of oxygen is preferably the saturation amount with air at the operating temperature of the bath.

When used, the inert gas is preferably premixed with the oxygen or air prior to the introduction into the bath. However, the individual gases can be introduced into the bath separately, if desired. The cupric ion source in the second electroless plating bath is employed in amounts of about 8.8 to about 10 grams per liter, calculated as $CuSO_4$. The reducing agent is present in amounts of about 2 to about 4 milliliters per liter and preferably about 2 to about 2.5 milliliters per liter. The preferred reducing agent is formaldehyde and is preferably employed as a 37% solution.

The amount of complexing agent employed in the second electroless plating bath is about 36 to about 40 grams per liter.

The amount of surfactant, if present, is usually about 0.02 to about 0.3 grams per liter. In addition, the preferred pH of the second electroless plating bath is between 11.6 and 11.8 and most preferably between 11.7 and 11.8. In addition, the second electroless plating bath has a specific gravity within the range of 1.060 to 1.080. Moreover, the temperature of the second electroless plating bath is preferably maintained between about 70°

C. and 80° C., and more preferably between about 70° C. and 75° C., and most preferably about 72° C. to about 74° C.

The plating from the second electroless plating bath is generally from about 8 to about 20 hours or until the desired thickness of copper film is achieved. Normally, the film is plated to thicknesses of up to about 2 mils.

Use of the second electroless plating bath provides for improved ductility of the copper since such tends to prevent or avoid the absorption of hydrogen gas on the surface which tends to cause embrittlement of the plated copper. It has been observed that the cyanide is preferentially absorbed onto the copper surface, thereby preventing the absorption of hydrogen gas thereon. Moreover, the quantity of oxygen and cyanide in the second electroless plating bath tends to prevent nodular formation. However, if the second electroless plating bath were employed as the initial plating bath to coat onto the seeded or catalyzed dielectric substrate, such would tend to result in plating voids and defects and, as stated hereinabove, would tend to attack and dissolve the catalyst coating on the dielectric substrate.

It is further noted that the rate of plating from the second electroless plating bath is somewhat increased, as compared to the plating baths now in operation.

The following non-limiting example is presented to further illustrate the present invention.

EXAMPLE

About 100 epoxy-glass laminate boards are immersed into a bath of about 0.05 grams of Reten per 100 milliliters of an 8% HCl aqueous solution for about three minutes. The substrates are then rinsed with deionized water and dried with air. Next, the coated substrates are immersed in a bath of about 1.5 grams per liter of $PdCl_2$, about 100 grams per liter of $SnCl_2$, and about 280 milliliters per liter of 37% HCl at about 65° F. for about three minutes. The substrates are then air dried. The substrates are then immersed in a plating tank containing an electroless copper plating bath having about 8.4 grams per liter of $CuSO_4$, about 44 grams per liter of ethylene diamine tetraacetic acid, 8 ppm of NaCN, 2.5 milliliters per liter of formaldehyde, 1.2 ppm of dissolved oxygen, a pH of 11.7, a specific gravity of 1.069. The bath plates at a rate of about 0.091 mils per hour. Plating on substrates immersed into the bath takes about fifteen minutes. Since all of the boards are not immersed into the plating bath at the same time, plating for the initial boards inserted into the bath proceeds for about forty minutes, whereas that for the latter immersed boards is for about fifteen minutes. After the duration of about forty minutes plating, the composition of the plating bath is changed, which takes about one to two hours for complete transformation to the second plating bath. The second plating bath contains 9.6 grams per liter of $CuSO_4$, 37 grams of ethylene diamine tetraacetic acid, 18 ppm of NaCN, 2.5 milliliters per liter of formaldehyde, 3 ppm of dissolved oxygen, has a pH of 11.75, a specific gravity of 1.066, and an average plating rate of 0.104 mils per hour. The plating in the second plating bath is continued for about fourteen to about sixteen hours to provide about 1.35 mils of copper plating on the surfaces.

The boards are removed from the plating tank and inspected. Almost no extraneous copper is found and the nodule rating is 0.5. In addition, the boards demonstrated extremely low defect rates with respect to voids and pass the normal inspection tests employed commercially.

What is claimed is:

1. A process for plating copper onto a substrate which is catalytic for the deposition of copper which comprises plating a first layer of copper onto said substrate from a first alkaline electroless copper plating bath containing about 4 to 7 ppm of cyanide ions and an oxygen content of 1.5 ppm or less; plating a second layer of copper onto said first layer of copper from a second alkaline electroless copper plating bath containing about 8 to 10 ppm of cyanide ion and an oxygen content of about 2.5 to 4 ppm; and wherein values of the oxygen content are for baths at a temperature of about 70° C. to 80° C.

2. The process of claim 1 wherein said substrate is a dielectric substrate rendered catalytic for the deposition of the copper.

3. The process of claim 2 which includes seeding the dielectric substrate with a seeder composition containing palladium and tin.

4. The process of claim 3 wherein prior to seeding, the substrate is contacted with a composition containing a multifunctional ionic polymer material containing at least two available ionic moieties, wherein said ionic moieties are of a charge opposite from the charge associated with the seeder particles to be subsequently applied to the substrate.

5. The process of claim 4 wherein said multifunctional ionic polymer material is a multifunctional cationic material.

6. The process of claim 4 wherein said multifunctional ionic polymer material is a copolymer of acrylamide and ammonium quaternary compounds.

7. The process of claim 4 wherein said multifunctional ionic polymer material is a copolymer of acrylamide and betamethacryloxyethyltrimethyl ammonium methyl sulfate.

8. The process of claim 1 wherein the oxygen content of said first alkaline electroless copper plating bath is 0.5 to about 1.5 ppm.

9. The process of claim 1 wherein the oxygen content of said first plating bath is 1 to about 1.5 ppm.

10. The process of claim 1 wherein the oxygen content of said second alkaline electroless copper plating bath is 3 to 3.5 ppm.

11. The process of claim 1 wherein said first alkaline electroless copper plating bath contains a cupric ion source in amounts of about 8.0 to about 8.8 grams per liter calculated as $CuSO_4$; about 2 to about 4 milliliters per liter of a reducing agent; about 40 to about 45 grams per liter of complexing agent for the cupric ions; has a pH of about 11.6 to about 11.8; and is at a temperature between about 70° C. and 80° C.

12. The process of claim 11 wherein said cupric ion source is $CuSO_4.5H_2O$, said reducing agent is formaldehyde, and said complexing agent is ethylene diamine tetraacetic acid or salt thereof; and said cyanide is an alkali metal cyanide.

13. The process of claim 11 wherein the second electroless plating bath contains about 8.8 to about 10 grams per liter of cupric ion source, calculated as $CuSO_4.5H_2O$; a reducing agent in amounts of about 2 to about 4 milliliters per liter; a complexing agent in amounts of about 36 to about 40 grams per liter, has a pH of about 11.6 to about 11.8, and is at a temperature of about 70° C. to about 80° C.

14. The process of claim 13 wherein said cupric ion source is $CuSO_4 \cdot 5H_2O$, said reducing agent is formaldehyde, said complexing agent is ethylene diamine tetraacetic acid or salt thereof.

15. The process of claim 1 wherein the first and second electroless plating baths are maintained at a temperature of about 70° C. to about 75° C. during plating.

16. The process of claim 1 wherein the first and second electroless plating baths are maintained at a temperature of about 72° C. to about 74° C. during plating.

17. The process of claim 1 wherein the plating with the first electroless plating bath is for about 15 minutes to about 2 hours and the plating with the second electroless plating bath is about 8 to about 20 hours.

18. The process of claim 1 wherein the plating with the first electroless plating bath and the second electroless plating bath occurs in the same plating tank by changing the plating bath.

19. The process of claim 1 wherein the amounts of cupric ion source and complexing agent in the first alkaline electroless copper plating bath differ from the amounts of cupric ion source and complexing agent in the second electroless plating bath.

20. The process of claim 13 wherein the first alkaline electroless copper plating bath contains a cupric ion source in amounts of about 8.0 to about 8.4 grams per liter calculated as $CuSO_4$.

* * * * *

UNITED STATES PATENT AND TRADEMARK OFFICE
CERTIFICATE OF CORRECTION

PATENT NO. : 4,525,390
DATED : June 25, 1985
INVENTOR(S) : Alpaugh, et al.

It is certified that error appears in the above—identified patent and that said Letters Patent is hereby corrected as shown below:

Column 3, line 52, please change "4,478,885" to --- 4,478,883 ---.

Signed and Sealed this

Thirty-first Day of December 1985

[SEAL]

Attest:

DONALD J. QUIGG

*Attesting Officer*    *Commissioner of Patents and Trademarks*